United States Patent [19]

Gerrish et al.

[11] Patent Number: 5,770,922
[45] Date of Patent: Jun. 23, 1998

[54] BASEBAND V-I PROBE

[75] Inventors: Kevin S. Gerrish; Daniel F. Vona, Jr., both of Rochester, N.Y.

[73] Assignee: ENI Technologies, Inc., Rochester, N.Y.

[21] Appl. No.: 684,833

[22] Filed: Jul. 22, 1996

[51] Int. Cl.$^6$ .................................................... H01J 7/24
[52] U.S. Cl. .............................. 315/111.21; 315/111.51; 315/224; 330/294; 219/121.21; 219/121.36
[58] Field of Search .................... 315/111.21, 111.51, 315/111.41, 111.71, 224, 39; 333/32; 330/294, 295, 291, 124 R; 219/121.21, 121.36, 121.43, 250

[56] References Cited

U.S. PATENT DOCUMENTS

| | | | |
|---|---|---|---|
| 4,629,940 | 12/1986 | Gagne et al. | 315/111.51 |
| 5,556,549 | 9/1996 | Patrick et al. | 216/61 |
| 5,565,737 | 10/1996 | Keane | 315/111.21 |
| 5,712,592 | 1/1998 | Stimson et al. | 315/111.51 X |

*Primary Examiner*—Benny Lee
*Assistant Examiner*—Haissa Philogene
*Attorney, Agent, or Firm*—Trapani & Molldrem

[57] ABSTRACT

An RF probe for a plasma chamber picks up current and voltage samples of the RF power applied to an RF plasma chamber, and the RF voltage and current waveforms are supplied to respective mixers. A local oscillator supplies both mixers with a local oscillator signal at the RF frequency plus or minus about 15 KHz, so that the mixers provide respective voltage and current baseband signals that are frequency shifted down to the audio range. The phase relation of the applied current and voltage is preserved in the baseband signals. These baseband signals are then applied to a stereo, two-channel A/D converter, which provides a serial digital signal to a digital signal processor or DSP. A local oscillator interface brings a feedback signal from the DSP to the local oscillator. The DSP can be suitably programmed to obtain complex Fast Fourier Transforms of the voltage and current baseband samples. The frequency-domain spectra are analyzed to obtain, with great accuracy, magnitude of voltage and current and phase angle. Other parameters are derived from these three.

15 Claims, 3 Drawing Sheets

BASEBAND V-I PROBE

BACKGROUND OF THE INVENTION

This invention relates to plasma generation equipment, and is particularly directed to probes for detecting the current, voltage, and phase of radio frequency (RF) electrical power that is being supplied to an RF plasma chamber.

In a typical RF plasma generator arrangement, a high power RF source produces an RF wave at a preset frequency, i.e., 13.56 MHz, and this is furnished along a power conduit to a plasma chamber. Because there is typically a severe impedance mismatch between the RF power source and the plasma chamber, an impedance matching network is interposed between the two. There are non-linearities in the plasma chamber, and because of these and because of losses in the line and in the impedance matching network, not all of the output power of the RF generator reaches the plasma chamber. Therefore, it is conventional to employ a probe at the power input to the plasma chamber to detect the voltage and current of the RF wave as it enters the plasma chamber. By accurately measuring the voltage and current as close to the chamber as possible, the user of the plasma process can obtain a better indication of the quality of the plasma. This in turn yields better control of the etching or deposition characteristics for a silicon wafer or other workpiece in the chamber.

At the present time, diode detection probes are employed to detect the amplitude of the current and voltage waveforms. These probes simply employ diode detector circuits to rectify the voltage and current waveforms, and deliver simple DC metering outputs for voltage and for current. These probes have at least two drawbacks in this role. Diode detectors are inherently non-linear at low signal levels, and are notoriously subject to temperature drift. The diode detector circuits also are limited to detecting the signal peaks for the fundamental frequency only, and cannot yield any information about higher or lower frequencies present in the RF power waveform. In addition to this, it is impossible to obtain phase angle information between the current and voltage waveforms, which renders the power measurement less accurate.

One proposal that has been considered to improve the detection of RF power has been to obtain digital samples of the voltage and current outputs of a probe, using flash conversion, and then to process the samples on a high-speed buffer RAM. However, this proposal does have problems with accuracy and precision. At the present time, flash conversion has a low dynamic range, normally being limited to eight bits of resolution. To gain reasonable phase accuracy for plasma customer requirements, it is necessary to reach a precision of at least twelve bits, so that a phase angle precision of better than one degree can be obtained at full power. In addition, flash converters require an extremely fast RAM in order to buffer a block of samples before they are processed in a digital signal processor (DSP), and fast RAM circuitry is both space-consuming and expensive.

Voltage and current probes that are now in existence are limited in their performance by the fact that they can only monitor the voltage, current, and phase angle at one frequency, and even then such probes have a poor dynamic range. Examining a different frequency requires changing out the hardware, which can be costly and time consuming. This means also that good performance will ensue only if the load is linear, which is never the case with a plasma chamber. Unlike capacitors, inductors, and resistors, plasma chambers impose a highly non-linear load, which causes the sinusoidal waveform of the input power to become distorted. This distortion causes the resulting waveform to be a sum of sinusoids, with the frequency of each additional sinusoid being some integer multiple of the input sinusoidal frequency (i.e., harmonics). Conventional probes can provide voltage, current and coarse phase information, at best, for the fundamental voltage and current waveforms. This severely limits the accuracy of the system, and makes accurate and repeatable control impossible when there is a significant amount of voltage or current appearing in the harmonics.

OBJECTS AND SUMMARY OF THE INVENTION

It is an objective of this invention to provide a reliable and accurate probe, at low cost, for detecting the current and voltage of RF power being applied to a plasma chamber and for accurately finding the phase angle between the applied voltage and applied current.

It is a more specific object of this invention to provide a frequency shifting arrangement that converts the voltage and current to a lower frequency baseband signal to facilitate accurate detection of RF current and voltage of the applied power, as well as phase information.

According to an aspect of the invention, a plasma arrangement has an RF power generator that supplies an RF electrical wave at a predetermined frequency to a power input of a plasma chamber within which the RF electrical wave produces a plasma. A plasma probe picks up both an RF voltage waveform and an RF current waveform of the electrical wave. The plasma probe sends the RF voltage and current waveforms to an analysis board which converts the RF waveforms to baseband voltage and current signals. A controllable local oscillator provides a local oscillator signal which is a square wave. A voltage signal mixer has inputs that receive the RF voltage waveform and the local oscillator signal, respectively, and an output that provides an audio frequency (AF) baseband voltage signal. A current signal mixer has inputs that receive the RF current waveform and the local oscillator signal, respectively, and has an output that provides a baseband AF current signal. A stereo A/D converter has a first channel input to which the baseband voltage signal is applied, a second channel input to which the baseband current signal is applied, and a serial output that provides a time-synchronous serial digital signal containing alternate digital representations of the baseband voltage waveform and the baseband current waveform. A digital signal processor has an input coupled to the serial output of the stereo A/D converter. The digital signal processor is suitably programmed to take the input AF voltage and current signals, determine the amplitude and relative phase of the voltage and current signals, and compute relative RF parameters based on these signals. An external interface provides an output determination based on the amplitudes and relative phase. A local oscillator interface circuit couples the digital signal processor to the local oscillator so that the digital signal processor can control the frequency of the local oscillator signal. In a preferred embodiment, the local oscillator provides said local oscillator frequency within about 15 KHz of the plasma RF frequency, so that the difference frequency, that is, the baseband frequency of the baseband current and voltage signals, is approximately 0.2 KHz to 15 KHz. Also, the stereo A/D converter is preferably a high-fidelity audio-frequency stereo converter, and can be of the type that is frequently used in high-fidelity audio systems, such as a matched two-channel 20-bit A/D converter. The A/D converters preferably incorporate anti-aliasing filters band-limiting the input baseband signals to the range of 0.2 KHz to 20 KHz. The local oscillator preferably includes a programmable oscillator, and can also include a divide-by-two frequency divider following the programmable oscillator to maintain a constant duty cycle. Information about harmonics can be derived by changing the local oscillator signal to a multiple of the RF waveform frequency plus or minus up to 20 KHz.

According to another aspect of this invention, amplitude and relative phase information for current and voltage can be derived for an RF power wave that is applied at a predetermined frequency to a power input of a plasma chamber within which the RF power wave produces a plasma. A plasma probe picks up an RF voltage waveform and an RF current waveform of the applied power. The technique of this invention involves generating a local oscillator signal and mixing the local oscillator signal and the RF voltage and current waveforms to produce the voltage baseband signal at an audio frequency and the current baseband signal at an audio frequency. A feedback signal is supplied from a digital signal processor to control the frequency of said local oscillator signal. The voltage baseband signal and said current baseband signal are converted to a time-synchronous serial digital signal that is supplied to the digital signal processor, which is suitably programmed to compute the amplitudes and relative phase of the voltage and current baseband signals. The local oscillator signal is produced at a frequency that is within 0.20 KHz to 20 KHz of the predetermined frequency of said RF power wave, so that the baseband signals will have a frequency in the audio range of 200 Hz to 20 KHz. Preferably this is about 10 KHz.

The digital signal processor computes the amplitudes and relative phase of the voltage and current baseband signals, preferably by means of a Fast Fourier Transform (FFT) of the current and voltage baseband waveforms. Then, phase and magnitude measurements of the voltage and current baseband signals are made by tracking the baseband frequency of the current and voltage baseband signals. The phase and magnitude measurements can be carried out after the Fast Fourier Transform by extracting frequency spectra of the voltage and current waveforms from the fast Fourier transform. The extracted spectra are employed to compute the phase difference or phase angle between the voltage and current waveforms.

Computing the amplitudes and relative phase of the voltage and current baseband signals is carried out in the digital signal processor. A predetermined number of samples of the serial digital signal representing the baseband voltage waveform and the baseband current waveform, respectively, are transferred into the DSP, and these samples are multiplied by a predetermined window function to produce windowed current and voltage signals. Then, windowed voltage samples V and associated current samples I are processed as a complex waveform, $W = V + j*I$ (where j is the root of minus one), and the digital signal processor performs a complex Fast Fourier Transform operation FFT(W) on the complex waveform. This produces a complex output, from which the digital signal processor can extract current and voltage spectra. The amplitudes and relative phase of said voltage and current baseband signals can be obtained from vector summation of the voltage and current spectra, and from the arctangent of the resulting vector sums.

From these data, other useful values can be calculated which can be used in the accurate control of the RF plasma process, including but not limited to RMS voltage, RMS current, delivered (dissipated) power, forward power, reverse or reflected power, reactive power, apparent power, magnitude of load impedance, phase of load impedance, load resistance, load reactance, magnitude of reflection coefficient, phase of reflection coefficient, and voltage standing wave ratio (VSWR).

The above and other objects, features, and advantages of this invention will become apparent from the ensuing description of a preferred embodiment, which should be read in conjunction with the accompanying Drawing.

DETAILED DESCRIPTION OF THE PREFERRED EMBODIMENT

Figure 1:
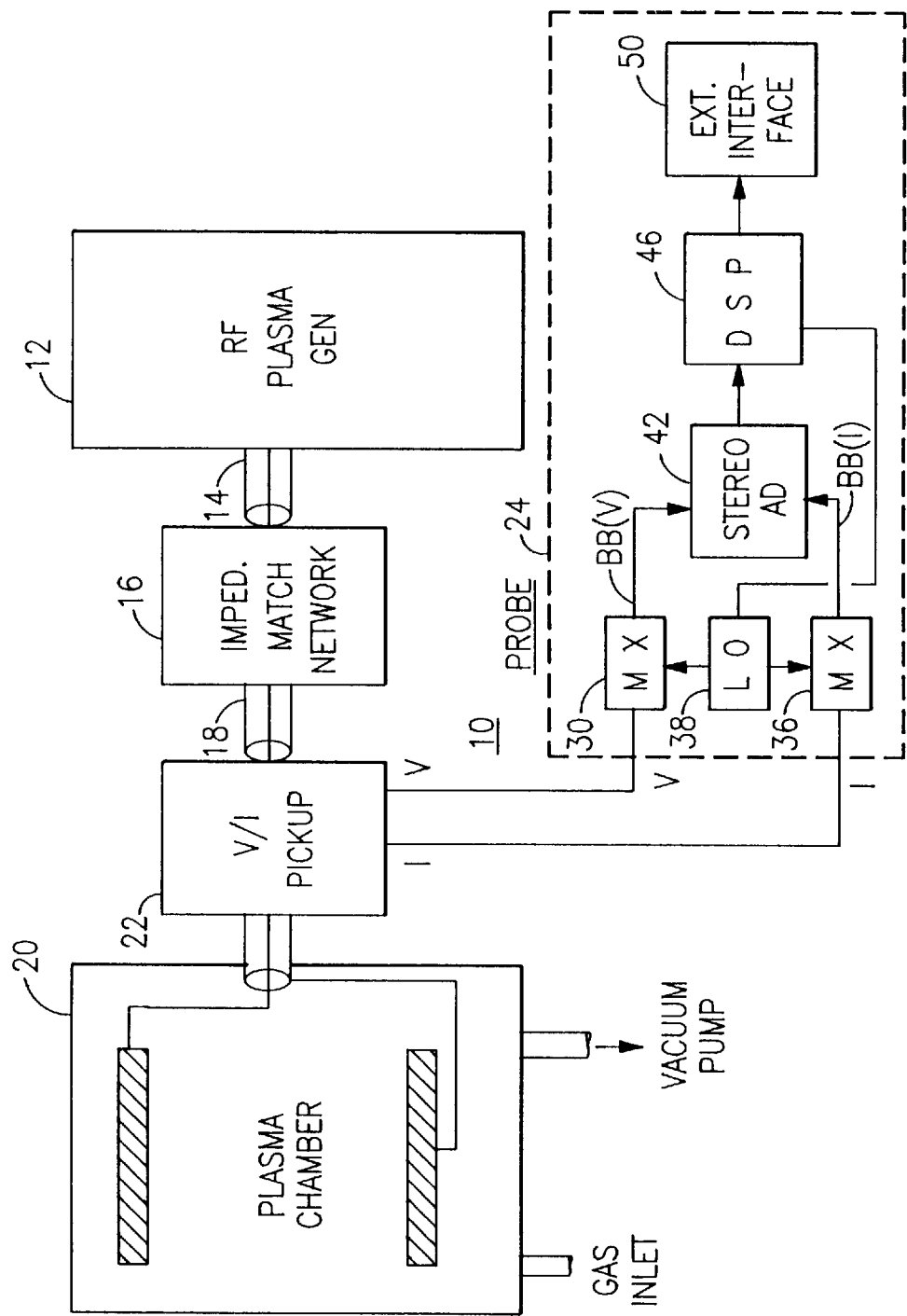
FIG. 1 is a block diagram of an RF plasma chamber, with associated RF plasma generator, impedance match network, V-I pickup, and V-I analysis board arrangement according to an embodiment of this invention.

With reference to the Drawing, and initially to FIG. 1, a plasma process arrangement 10, e.g., for etching a silicon wafer or other workpiece, has an RF power generator 12, which produces RF power at a prescribed frequency, e.g., 13.56 MHz at a predetermined power level, such as one kilowatt. The generator 12 supplies RF power along a conduit 14 to a matching network 16. The output of the matching network 16 is coupled by a power conduit 18 to an input of a plasma chamber 20. A probe voltage and current pickup device 22 samples the voltage $V_{RF}$ and the current $I_{RF}$ of the applied RF power as it enters the input to the chamber 20. The chamber 20 has a vacuum conduit associated with a not-shown vacuum pump and a gas inlet through which a noble gas, e.g., argon, is introduced into the chamber. The sampled voltage and current $V_{RF}$ and $I_{RF}$ are fed to a voltage and current (V-I) baseband probe arrangement 24 which measures the magnitudes or amplitudes of the applied voltage and current, and also computes the phase angle Φ between the applied voltage and current waveforms. These three values can be computed with high accuracy, and can in turn be used to calculate other parameters, as shall be discussed below.

The baseband V-I probe permits accurate determination of voltage amplitude |V|, current amplitude |I|, and phase Φ between voltage and current for an RF (radio frequency) signal. This can be in the range of 0.200 MHz to 67.8 MHz, permitting the user to analyze a plasma with greater precision than has been possible with more conventional analog techniques. The same concept can be applied beyond these frequencies to other ranges. An end result of this improved capability is improved process repeatability, improved process endpoint determination, higher yields, and more consistent yields. The V-I probe, when employed in connection with the RF path in an RF plasma system, allows the user to achieve a higher degree of control, and to achieve control using parameters beyond simply peak voltage and current values of the RF wave. With the baseband V-I probe arrangement 24 of this invention, the user can control the plasma process based on power delivered to the plasma, whether at the RF frequency of the generator or at any other frequency, impedance of the plasma, either at the frequency of the RF waveform or at any frequency within the bandwidth of the arrangement 24. For example, harmonic analysis can be used for a more accurately determination of completion for an etching step in an integrated circuit (IC) wafer.

Figure 2:
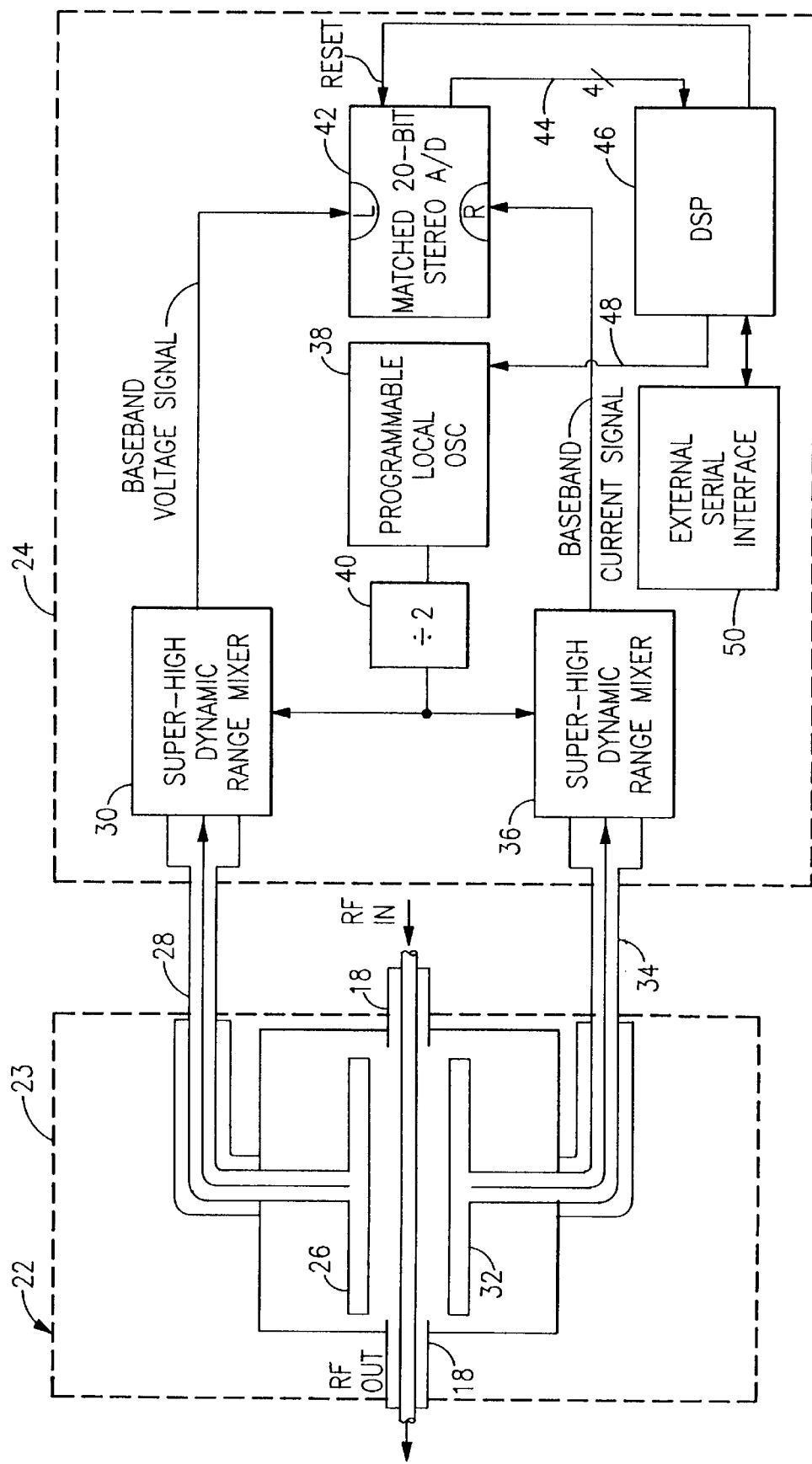
FIG. 2 is a simplified schematic diagram of the V-I pickup and the signal analysis circuitry of the V-I probe arrangement.

As shown in more detail in FIG. 2, the probe pickup 22 has a shield or housing 23 that electrically seals the pickup. A voltage pickup board 26 is coupled by a triax cable 28 to a super-high dynamic range mixer 30 in the probe circuit arrangement 24. The triax cable 28 has an outer braid coupled to the housing 23 and an inner braid going to the chassis ground of the probe circuit arrangement 24. A current pickup board 32 inside the pickup 22 is coupled by a triaxial cable 34 to a super-high dynamic range mixer 36. The cable 34 has its outer and inner braids connected in a fashion similar to that of the cable 28. A programmable local oscillator 38 generates a local oscillator signal that is within twenty kilohertz of the applied RF waveform, that is, at a frequency $F_{RF} \pm 0.20$ KHz to $F_{RF} \pm 20$ KHz. The local oscillator has an associated divide-by-two counter 40 to ensure a proper duty cycle. The local oscillator 38 can favorably include a single chip phase lock loop (PLL) frequency synthesizer, and this can have a design frequency range of 0.320 to 120 MHz. The same local oscillator signal, at the same frequency and phase, is fed to the local oscillator inputs of both mixers 30 and 36. In the preferred embodiment the frequency of the local oscillator 38 is chosen so that the local oscillator (l.o.) signal, at the output of the divide-by-two counter 40, is the applied waveform frequency plus or minus 15 KHz. The local oscillator signal is fed to l.o. inputs of both mixers 30 and 36, and the same produce a voltage baseband signal and a current baseband signal, respectively. The baseband signals each have the same baseband frequency, and as a result of the proper choice of local oscillator frequency, the voltage and current baseband signals are in the range of 0.20 to 20 KHz, that is, in the audio frequency range. Proper matching of the baseband voltage and current frequencies is assured by the fact that the voltage and current waveforms from the pickup 22 (which are, of course, identical in frequency) are both mixed with the very same local oscillator signal.

The baseband voltage signal and the baseband current signal are then supplied to respective inputs L and R of a matched, two-channel 20-bit stereo A/D converter 42. This is a low-cost, available item that is frequently employed in high-fidelity audio products. The preferred converter 42 incorporates two highly matched, independent A/D converters, with a digital output that is a simple synchronous serial digital signal that easily interfaces with other digital components. The A/D converter incorporates anti-aliasing filters which band-limit the input baseband signals to the range of 0.20 to 20 KHz. The output is supplied over a serial data interface 44, as alternate baseband voltage and current samples, to a signal input of a digital signal processor or DSP 46. There are well-known support hardware elements associated with the DSP 46, and these are not shown in the Drawing.

The DSP 46 processes the digitized baseband voltage and current signals, and calculates the magnitude |V| of the voltage, the magnitude |I| of the current, and the phase angles of the baseband voltage and current signals, from which it derives the relative phase Φ of the applied voltage and current. The DSP is coupled by means of a local oscillator serial program interface 48 to a feedback input of the local oscillator 38 to form a closed loop. The DSP 46 is also coupled to an external serial interface, which in turn can be coupled to controls for the plasma process arrangement, e.g., to control the voltage or current supplied from the RF plasma generator 12 or to control the impedance of the impedance match network 16.

The mixers 30 and 36, which both receive the same l.o. signal, make it possible to reduce the frequency of the applied RE voltage and applied RF current from the megahertz frequency range to the kilohertz frequency range in a single mixing step. Once the two signals are mixed to the baseband frequency range, the baseband signals are filtered, via low-pass filters (not shown) to remove the upper side band, thereby leaving only the lower sideband, or baseband, signals. The phase relations in the applied voltage and applied current waveforms are preserved in the two baseband signals. These are fed to the A/D converter 42 where they are converted, e.g., with a sampling conversion frequency of 48 KHz. After a suitable number of baseband voltage and current samples are taken, the DSP 46 carries out phase and magnitude measurements.

Figure 3:
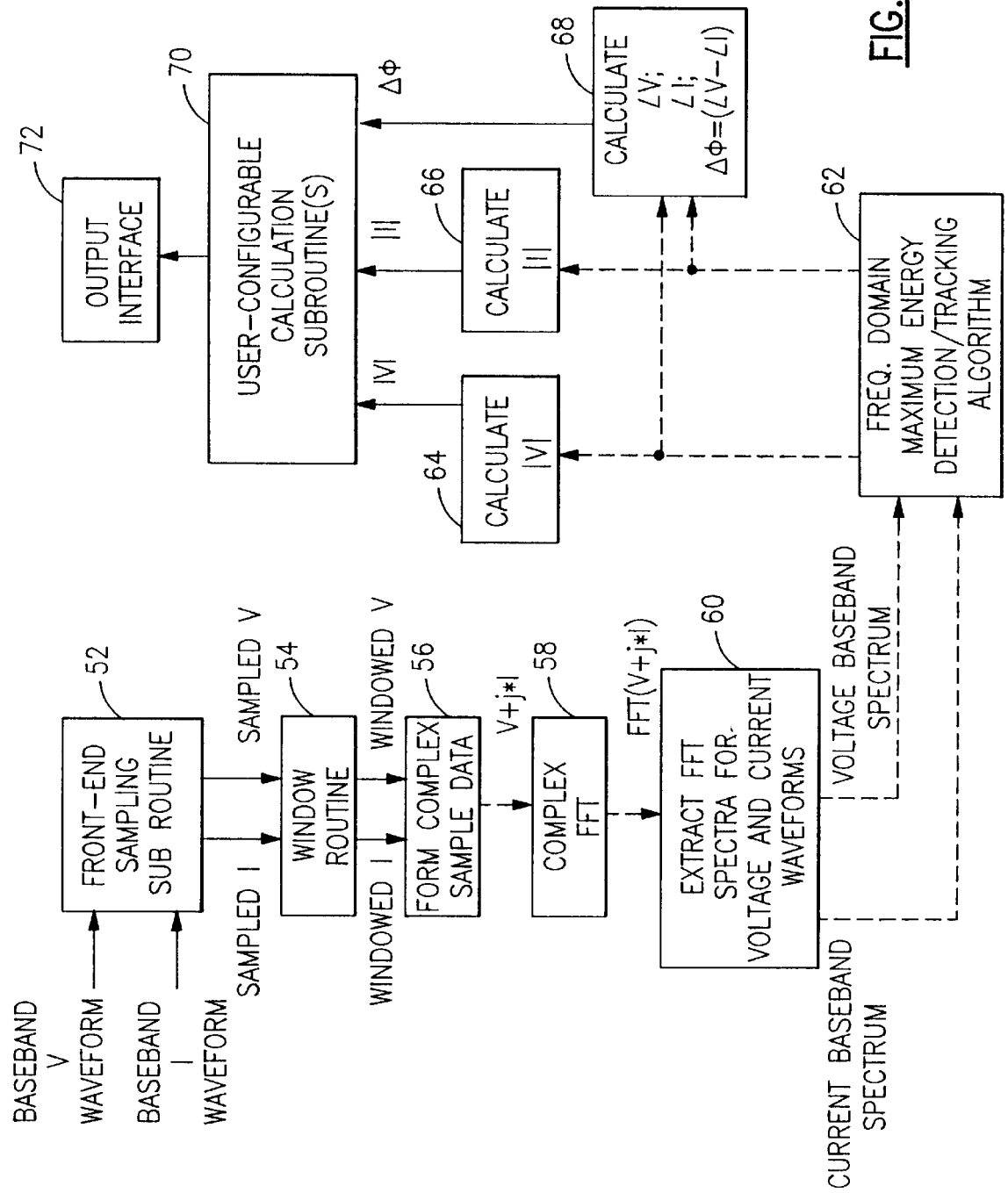
FIG. 3 is a software logic flow diagram for explaining the operation of the V-I probe arrangement of this invention.

Once a predetermined (or selectable) number of baseband current and voltage samples have been transferred from the converter 42 to the DSP 46, the DSP carries out a series of complex signal processing algorithms to process the data. This operation is carried out as generally described now, with reference to FIG. 3. In this diagram the solid lines between the routines or operations represent processing of real numbers, while dash lines represent the processing of complex (i.e., real plus imaginary) numbers.

Once a suitable number of samples of each of the voltage and current baseband waveforms have been taken, as shown generally as sampling subroutine 52, the sampled current data and sampled voltage data are multiplied by a window function or window routine 54. The window function is chosen such that there is a minimum amount of frequency peak spreading in the frequency domain. Here, the default window function is the Harris-Blackman window, but other window functions could be employed and changed, via a window generator subroutine.

In order to maintain processing efficiency, the orthogonal characteristics of a single complex fast Fourier transform or FFT are exploited to derive the spectrum of each of the voltage and current waveforms. Due to the nature of the complex FFT, the phase between the two spectra can be simply extracted using vector summation and the arc tangent function. To achieve this, the windowed current and voltage sample data are first combined (complex sample data routine 56) into one complex waveform sample W, that is W=V+j*I, where j is the base of imaginary numbers, i.e. the square root of negative one, or j=√(−1). The complex waveform W is then subjected to a subroutine 58 that calculates the FFT of the waveform W as a set of complex numbers, to wit, FFT(V+j*I). Once the complex FFT is completed, the results are subjected to an extraction routine 60, which extracts the current and voltage spectra of the FFT output, using vector summation. From this stage, the current baseband spectrum and the voltage baseband spectrum are treated in a frequency domain maximum energy detection and tracking algorithm 62. Here, the frequency of the maximum energy signal is determined and tracked for both the voltage and current waveforms. From these data, the magnitude |V| of the voltage and the magnitude |I| of the current are calculated, as in subroutines 64 and 66, and the phase angles of voltage and current are calculated, as in routine 68. While the instantaneous phase angle of voltage or current alone is not particularly useful, the difference between these two produces the relative phase angle Φ, which represents the actual phase angle of the plasma load. These values |V|, |I|, and Φ are employed in any of a set of user-configurable calculation subroutines 70 to produce any of a large number of parameters that can be employed in process control. A short list of these values is provided as follows:

a. RMS voltage $|V|=(avg(V^2))^{0.5}=V_{rms}$ b. RMS current $|I|=(avg(I^2))^{0.5}=I_{rms}$ c. Phase angle $\Phi = \angle I - \angle V$ d. Delivered (dissipated) Power $P=|V|*|I|* \cos(\Phi)$ e. Forward (apparent) Power $P_F = P \div (1-|\Gamma|^2)$ f. Reverse Power $P_R = P_F - P$ g. Reactive Power $P_{REACT} = |V|*|I|* \sin(\Phi)$ h. Magnitude of Load Impedance $|Z_L|=|V|\div|I|$ i. Phase of Load Impedance $\angle Z_L = \Phi$ j. Load Resistance $Z_{LR}=\text{Real}(Z_L)=|Z_L|* \cos(\Phi)$ k. Load Reactance $Z_{LI}=\text{Imag}(Z_L)=|Z_L|* \sin(\Phi)$ l. Magnitude of Reflection $$\text{Coefficient}|\Gamma|=(((Z_{LR}-50)^2+(Z_{LI})^2)/((Z_{LR}+50)^2+(Z_{LI}^2)))^{0.5}$$

m. Phase of Reflection $$\text{Coefficient} \angle \Gamma = \text{Arctan}(Z_{LI}/(Z_{LR}-50))-\text{Arctan}(Z_{LI}/(Z_{LR}+50))$$

n. Voltage Standing Wave Ratio $$VSWR\ S=(1+|\Gamma|)/(1-|\Gamma|)$$

The foregoing values, or others, are computed in near real time and are conditioned in an output interface routine, where they are supplied, e.g., through external serial interface 50, to control the RF plasma generator 12 or the impedance match network 16.

It should be appreciated that with the probe arrangement of the present invention, the above parameters are obtained with an improvement in smaller size, lower cost, lower drift, higher accuracy (especially at high phase angles) and with greater flexibility of integration than with existing probe systems or techniques. Moreover, unlike conventional, diode based systems, the arrangement of this invention permits harmonic analysis and permits plasma power and impedance measurements at user-selected frequencies. Also, this invention permits the data to be easily exported, and facilitates remote user operation and monitoring.

The phase measurement taken in this manner is highly accurate, i.e., to within one-fifth degree, i.e. ±0.2°. This cannot be achieved with other techniques, such as zero-crossing detectors.

Also, while the arrangement of the above-described embodiment has been described in conjunction with an RF waveform frequency of 13.56 MHz, the invention can be used over a wide range of frequencies, including other process RF frequencies such as 27.12 MHz, 40.68 MHz, etc.

While the invention has been described with reference to a preferred embodiment, the invention is certainly not limited to that precise embodiment. Rather, many modifications and variations would present themselves to persons skilled in the art without departing from the scope and spirit of the invention, as defined in the appended claims.

We claim:

1. A plasma arrangement in which an RF power generator supplies an RF electrical wave in an RF frequency range to a power input of a plasma chamber within which said RF electrical wave produces a plasma, and in which a plasma probe picks up an RF voltage waveform of said electrical wave and an RF current waveform of said electrical wave; comprising the improvement wherein said plasma probe comprises a controllable local oscillator providing a local oscillator signal; a voltage signal mixer having inputs receiving said RF voltage waveform and said local oscillator signal, respectively, and an output providing a baseband voltage signal; a current signal mixer having inputs receiving said RF current waveform and said local oscillator signal, respectively, and having an output providing a baseband current signal; an A/D converter having a first channel input to which said baseband voltage signal is applied, a second channel input to which said baseband current signal is applied, and a serial output providing a time-synchronous serial digital signal containing digital representations of said baseband voltage waveform and said baseband current waveform; a digital signal processor having an input coupled to the serial output of said A/D converter, said digital signal processor being suitably programmed to compute amplitude and relative phase of said voltage baseband signal and said current baseband signal; external interface means for providing an output determination based on said amplitudes and relative phase; and local oscillator interface means coupled to said digital signal processor and to said local oscillator permitting said digital signal processor to control the frequency of said local oscillator.

2. The arrangement of claim 1, wherein said local oscillator provides said local oscillator frequency within approximately 0.2 KHz to 20 KHz of the frequency of the power input wave.

3. The arrangement of claim 1 wherein said A/D converter is a high-fidelity audio-frequency stereo converter.

4. The arrangement of claim 1 wherein said local oscillator provides said local oscillator signal at a local oscillator frequency that differs from the frequency of said input power wave by a difference of within 20 KHz.

5. The arrangement of claim 1 wherein said local oscillator comprises a programmable oscillator.

6. The arrangement of claim 1 wherein said local oscillator also comprises a divide-by-two frequency divider following said programmable oscillator.

7. The arrangement of claim 1 wherein said A/D converter includes a matched two-channel 20-bit stereo A/D converter.

8. The arrangement of claim 1 wherein said serial output provides said time-synchronous serial digital signal containing digital representations of said baseband voltage waveform and said baseband current waveform so that said representation of current and voltage appear alternately.

9. A method of deriving amplitude and relative phase information for current and voltage of an RF power wave that is applied at a radio frequency (RF) to a power input of a plasma chamber within which said RF power wave produces a plasma, and in which a plasma probe picks up an RF voltage waveform and an RF current waveform of said power wave; comprising the steps of generating a local oscillator signal; mixing said local oscillator signal and said RF voltage waveform to produce a voltage baseband signal at an audio frequency; mixing said local oscillator signal and said RF current waveform to produce a current baseband signal at said audio frequency; supplying a feedback signal from said digital signal processor to control the frequency of said local oscillator signal. converting said voltage baseband signal and said current baseband signal to a serial digital signal; supplying said serial digital signal to a suitably programmed digital signal processor; supplying a feedback signal from said digital signal processor to control the frequency of said local oscillator signal; and computing the amplitudes and relative phase of said voltage and current baseband signals.

10. The method of claim 9, wherein said step of providing said local oscillator signal includes providing said local oscillator signal at a frequency that is within between 0.20 KHz and 20 KHz of the frequency of the applied RF power wave.

11. The method of claim 9, wherein said step of computing the amplitudes and relative phase of said voltage and current baseband signals includes calculating a Fast Fourier Transform of the current and voltage baseband waveforms, and making phase and magnitude measurements of the voltage and current baseband signals by tracking the baseband frequency of said baseband signals.

12. The method of claim 11, wherein said step of making phase and magnitude measurements includes, following said calculating of said Fast Fourier Transform, extracting frequency spectra of said voltage and current waveforms from said fast Fourier transform.

13. The method of claim 12, further comprising computing, from said spectra of said voltage and current waveforms, a phase difference as between said voltage and current waveforms.

14. The method of claim 12, wherein said computing the amplitudes and relative phase of said voltage and current baseband signals comprises transferring a plurality of samples of said serial digital signal representing said baseband voltage waveform and said baseband current waveform, respectively; multiplying said samples by a predetermined window function to produce windowed current and voltage signals; processing the respective voltage samples V and associated current samples I as a complex waveform, $W=V+j*I$ (where j is the root of minus one), performing a complex Fast Fourier Transform operation on said complex waveform $FFT(W)$ to produce a complex output, and extracting the current and voltage spectra from said complex output.

15. The method of claim 14, wherein said computing the amplitudes and relative phase of said voltage and current baseband signals comprises extracting said relative phase angle by finding the vector sums of said voltage and current spectra, and computing arctangents of the resulting vector sums.

* * * * *

UNITED STATES PATENT AND TRADEMARK OFFICE
CERTIFICATE OF CORRECTION

PATENT NO. : 5,770,922
DATED : June 23, 1998
INVENTOR(S) : Kevin S. Gerrish et al.

It is certified that error appears in the above-identified patent and that said Letters Patent is hereby corrected as shown below:

On the title page item [54] and in column 1 line 1,

"BASEBAND V-I PROBE" should read --BASEBAND RF VOLTAGE-CURRENT PROBE--.

Col. 4, line 18, line 21, line 47, line 57 and line 61:

"V-I" should read --voltage-current--.

Signed and Sealed this

First Day of June, 1999

Attest:

Attesting Officer

Q. TODD DICKINSON

Acting Commissioner of Patents and Trademarks